US007648874B2

United States Patent
Lee et al.

(10) Patent No.: US 7,648,874 B2
(45) Date of Patent: Jan. 19, 2010

(54) METHOD OF FORMING A DIELECTRIC STRUCTURE HAVING A HIGH DIELECTRIC CONSTANT AND METHOD OF MANUFACTURING A SEMICONDUCTOR DEVICE HAVING THE DIELECTRIC STRUCTURE

(75) Inventors: Jong-Cheol Lee, Seoul (KR); Sung-Tae Kim, Seoul (KR); Young-Sun Kim, Gyeonggi-do (KR); Cha-Young Yoo, Gyeonggi-do (KR); Gab-Jin Nam, Seoul (KR); Young-Geun Park, Gyeonggi-do (KR); Jae-Hyoung Choi, Gyeonggi-do (KR); Jae-Hyun Yeo, Gyeonggi-do (KR); Ha-Jin Lim, Seoul (KR); Yun-Seok Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 377 days.

(21) Appl. No.: 11/339,416

(22) Filed: Jan. 25, 2006

(65) Prior Publication Data

US 2006/0166476 A1 Jul. 27, 2006

(30) Foreign Application Priority Data

Jan. 25, 2005 (KR) .................... 10-2005-0006543

(51) Int. Cl.
*H01L 21/00* (2006.01)
(52) U.S. Cl. .................... 438/240; 438/257; 438/785
(58) Field of Classification Search ....... 438/FOR. 208, 438/240, 257–267, 785
See application file for complete search history.

(56) References Cited

U.S. PATENT DOCUMENTS

| | | | | |
|---|---|---|---|---|
| 6,074,918 | A * | 6/2000 | Lee | 438/283 |
| 6,797,645 | B2 | 9/2004 | Hwang et al. | |
| 2001/0031524 | A1 * | 10/2001 | Kim et al. | 438/201 |
| 2002/0182847 | A1 * | 12/2002 | Yokoyama et al. | 438/622 |
| 2002/0192902 | A1 * | 12/2002 | Kimura et al. | 438/253 |
| 2005/0106896 | A1 * | 5/2005 | Fukuchi | 438/778 |
| 2005/0236678 | A1 * | 10/2005 | Sato et al. | 257/410 |
| 2007/0128884 | A1 * | 6/2007 | Ota et al. | 438/778 |

FOREIGN PATENT DOCUMENTS

| | | |
|---|---|---|
| JP | 2003-204061 | 7/2003 |
| KR | U1998-032692 | 9/1998 |
| KR | A1999-0077767 | 10/1999 |
| KR | 1020040059878 | 7/2004 |

* cited by examiner

*Primary Examiner*—Richard A. Booth
(74) *Attorney, Agent, or Firm*—Myers Bigel Sibley & Sajovec

(57) ABSTRACT

In a method of manufacturing a dielectric structure, after a first dielectric layer is formed on a substrate by using a metal oxide doped with silicon, the substrate is placed on a susceptor of a chamber. By treating the first dielectric layer with a plasma in controlling a voltage difference between the susceptor and a ground, a second dielectric layer is formed on the first dielectric layer. The second dielectric layer including a metal oxynitride doped with silicon having enough content of nitrogen is formed on the first dielectric layer. Therefore, dielectric properties of the dielectric structure comprising the first and the second dielectric layers can be improved and a leakage current can be greatly decreased. By adapting the dielectric structure to a gate insulation layer and/or to a dielectric layer of a capacitor or of a non-volatile semiconductor memory device, capacitances and electrical properties can be improved.

30 Claims, 15 Drawing Sheets

METHOD OF FORMING A DIELECTRIC STRUCTURE HAVING A HIGH DIELECTRIC CONSTANT AND METHOD OF MANUFACTURING A SEMICONDUCTOR DEVICE HAVING THE DIELECTRIC STRUCTURE

RELATED APPLICATION

This application claims priority under 35 USC § 119 to Korean Patent Application No. 2005-6543 filed on Jan. 25, 2005, the contents of which are herein incorporated by reference in its entirety.

FIELD OF THE INVENTION

The present invention relates generally to a method of forming a dielectric structure and a method of manufacturing a semiconductor device including the dielectric structure and, more particularly, to a method of forming a dielectric structure having a high dielectric constant and a method of manufacturing a semiconductor device having same.

BACKGROUND OF THE INVENTION

Semiconductor memory devices are generally divided into volatile semiconductor memory devices that lose data over time, such as a dynamic random access memory (DRAM) device and a static random access memory (SRAM) device and nonvolatile semiconductor memory devices that do not lose data over time. Especially, in a volatile semiconductor memory device such as the DRAM, nowadays properties of a high storing capacity and a high response become more important as the semiconductor device is highly integrated.

Thus, researches on a material having a high permittivity instead of a conventional silicon nitride or a silicon oxide are actively under way now in order to increase an electrostatic capacity of a capacitor and improve an insulation property of a gate insulation layer. In order to acquire a material having this high permittivity, Korean Laid-Open Patent Publication No. 2004-59878 discloses a method of forming a hafnium silicon oxynitride layer by treating a hafnium oxide layer with ammonia plasma. In this method, even if the hafnium silicon oxide layer can be partially converted into hafnium silicon oxynitride layer, because the hafnium silicon oxide layer is not nitrated enough, it is not easy to secure a high dielectric constant required for the hafnium silicon oxynitride layer. Additionally, U.S. Pat. No. 6,797,645 (issued to Hwang et al.) discloses a method of using a zirconium oxide layer as a gate insulation layer after the zirconium oxide layer is nitrated by ammonia or nitrogen plasma and is oxidized again. However, even in this method, because the zirconium oxide layer is not nitrated enough, a thickness of the gate insulation layer increases and it is difficult to secure the high permittivity required.

On the other hand, it is required that a dielectric layer, which is formed between a floating gate and a control gate, should have a high permittivity in order to increase a capacity and an operation speed of a semiconductor device even in a non-volatile semiconductor device such as a flash memory device. Up to now, a dielectric layer having ONO construction in which an oxide layer, a nitride layer and an oxide layer are sequentially laminated in order has been widely used. In a non-volatile semiconductor memory device having this dielectric layer with the ONO construction, because basically a plurality of oxide layers and nitride layers are adopted as a dielectric layer, not only does the dielectric layer not have a permittivity required for the non-volatile semiconductor memory device, but a process of forming the dielectric layer is also complicated. Having considered the above problems, Korean Laid-Open Patent Publication No. 1998-32692 discloses a semiconductor device comprising a dielectric layer which is formed by doping an aluminum oxide ($Al_2O_3$), a yttrium oxide ($Y_2O_3$), a tantalum pentoxide ($Ta_2O_5$) or a vanadium pentoxide ($V_2O_5$) with zirconium (Zr), silicon (Si), titanium (Ti) and hafnium (Hf). In addition, Korean Laid-Open Patent Publication No. 1999-77767 discloses a floating gate memory device comprising a dielectric layer which includes an aluminum oxide or a yttrium oxide, or which includes an aluminum oxide, a yttrium oxide or a tantalum pentoxide doped with zirconium (Zr) or silicon (Si). When the dielectric layer including the metal oxide is adapted to the non-volatile semiconductor memory device, however, the performance of the semiconductor device drops because of a thermal damage in a successive high temperature process.

SUMMARY OF THE INVENTION

Some embodiments of the present invention provide a method of forming a dielectric structure having a high dielectric constant.

Some embodiments of the present invention provide a method of manufacturing a volatile semiconductor memory device including the dielectric structure of the high dielectric constant.

Some embodiments of the present invention provide a method of manufacturing a non-volatile semiconductor memory device having the dielectric structure of the high dielectric constant.

According to some embodiments of the present invention, there is provided a method for forming a dielectric structure. In the method of forming the dielectric structure, after a first dielectric layer is formed on a semiconductor substrate using a metal oxide doped with silicon, the semiconductor substrate having the first dielectric layer is loaded onto a susceptor disposed in a chamber. A second dielectric layer is formed on the first dielectric layer by treating the first dielectric layer with a plasma while controlling a voltage difference between the susceptor and a ground using a power source electrically connected to the chamber.

According to some embodiments of the present invention, the first dielectric layer may be formed by a chemical vapor deposition (CVD) process, an atomic layer deposition (ALD) process, a physical vapor deposition (PVD) process or a pulse laser deposition process.

According to some embodiments of the present invention, the metal oxide doped with silicon may include a metal oxide doped with silicon including transition metal in Group IV, a metal oxide doped with silicon including transition metal in Group V, or a metal oxide doped with silicon including rare earth metal. For example, the metal oxide doped with silicon may include titanium oxide doped with silicon, zirconium oxide doped with silicon, hafnium oxide doped with silicon, vanadium oxide doped with silicon, niobium oxide doped with silicon, tantalum oxide doped with silicon, scandium oxide doped with silicon, yttrium oxide doped with silicon or lanthanum oxide doped with silicon.

According to some embodiments of the present invention, the voltage difference between the susceptor and the ground may be in a range of about 300V to about 500V.

According to some embodiments of the present invention, the plasma may include ammonia plasma or nitrogen plasma.

According to some embodiments of the present invention, the first dielectric layer may be treated at a temperature of about 300° C. to about 900° C. for about 60 seconds to about 180 seconds by applying a power of about 250 W to about 800 W.

According to some embodiments of the present invention, the second dielectric layer may include a metal oxynitride doped with silicon.

In an example embodiment of the present invention, the second dielectric layer may have about 5% to about 25% by weight of nitrogen.

According to some embodiments of the present invention, the second dielectric layer may include a metal oxynitride doped with silicon including transition metal in Group IV, a metal oxynitride doped with silicon including transition metal in Group V, or a metal oxynitride doped with silicon including rare earth metal. For example, the second dielectric layer may include titanium oxynitride doped with silicon, zirconium oxynitride doped with silicon, hafnium oxynitride doped with silicon, vanadium oxynitride doped with silicon, niobium oxynitride doped with silicon, tantalum oxynitride doped with silicon, scandium oxynitride doped with silicon, yttrium oxynitride doped with silicon or lanthanum oxynitride doped with silicon.

According to some embodiments of the present invention, a first conductive structure may be formed on the substrate before forming the first dielectric layer.

According to some embodiments of the present invention, a second conductive structure may be formed on the second dielectric layer after forming the second dielectric layer.

According to some embodiments of the present invention, forming the first dielectric layer and forming the second dielectric layer may be N (N is a positive integer) times performed repeatedly.

According to some embodiments of the present invention, there is provided a method of manufacturing a semiconductor device. In the method of manufacturing the semiconductor device, after a first dielectric layer is formed on a semiconductor substrate using a metal oxide doped with silicon, the semiconductor substrate having the first dielectric layer is placed in a susceptor installed in a chamber. A first dielectric structure is formed on the semiconductor substrate by treating the first dielectric layer with a plasma while controlling a voltage difference between the susceptor and a ground using a power source electrically connected to the chamber. The first dielectric structure includes the first dielectric layer and a second dielectric layer formed on the first dielectric layer. After a gate structure is formed on the first dielectric structure, a contact region is formed at a portion of the semiconductor adjacent to the gate structure. A pad electrically connected to the contact region is formed, and then a storage electrode electrically connected to the pad is formed. After a second dielectric structure is formed on the storage electrode, a plate electrode is formed on the second dielectric structure.

In forming the second dielectric structure, a third dielectric layer is formed on the storage electrode using a metal oxide doped with silicon, and then the semiconductor device having the third dielectric layer is loaded on the susceptor. A fourth dielectric layer is formed on the third dielectric layer by treating the third dielectric layer with a second plasma while controlling a second voltage difference between the susceptor and the ground using the power source.

According to some embodiments of the present invention, the first voltage difference may be substantially same as the second voltage difference.

According to some embodiments of the present invention, each of the first voltage difference and the second voltage difference may be in a range of about 300V to about 500V.

According to some embodiments of the present invention, the first dielectric layer and the third dielectric layer may be formed by a chemical vapor deposition (CVD) process, an atomic layer deposition (ALD) process, a physical vapor deposition (PVD) process or a pulse laser deposition (PLD) process.

According to some embodiments of the present invention, each of the first dielectric layer and the third dielectric layer may include a metal oxide doped with silicon including transition metal in Group IV, a metal oxide doped with silicon including transition metal in Group V, or a metal oxide doped with silicon including rare earth metal.

According to some embodiments of the present invention, each of the first plasma and the second plasma may include ammonia plasma or nitrogen plasma.

In an example embodiment of the present invention, each of the first dielectric layer and the third dielectric layer may be treated at a temperature of about 300° C. to about 900° C. for about 60 seconds to about 180 seconds by applying a power of about 250 W to about 800 W.

According to some embodiments of the present invention, the second dielectric layer and the fourth dielectric layer may include metal oxynitride doped with silicon.

According to some embodiments of the present invention, each of the second dielectric layer and the fourth dielectric layer may include about 5% to about 25% by weight of nitrogen.

According to some embodiments of the present invention, each of the second dielectric layer and the fourth dielectric layer may include a metal oxynitride doped with silicon including transition metal in Group IV, a metal oxynitride doped with silicon including transition metal in Group V, or a metal oxynitride doped with silicon including rare earth metal.

According to some embodiments of the present invention, forming the first dielectric layer and forming the second dielectric layer may be N (N is a positive integer) times performed repeatedly.

According to some embodiments of the present invention, forming the third dielectric layer and forming the fourth dielectric layer may be N (N is a positive integer) times performed repeatedly.

According to some embodiments of the present invention, there is provided a method of manufacturing a semiconductor device. In the method of manufacturing the semiconductor device, after a tunnel oxide layer pattern is formed on the substrate, a floating gate is formed on the tunnel oxide layer pattern. A first dielectric layer is formed on the floating gate using a metal oxide doped with silicon, and then the semiconductor substrate having the first dielectric layer is loaded onto a susceptor installed in a chamber. A dielectric structure is formed on the floating gate by treating the first dielectric layer with a plasma while controlling a voltage difference between the susceptor and the ground using a power source electrically connected to the chamber. The dielectric structure includes the first dielectric layer and a second dielectric layer formed on the first dielectric layer. A control gate is formed on the dielectric structure.

According to some embodiments of the present invention, a second dielectric layer of a metal oxide doped with silicon having sufficient nitrogen content is formed on a first dielectric layer by treating the first dielectric layer with ammonia plasma or nitrogen plasma while controlling a voltage difference between a ground and a susceptor on which a semiconductor substrate is placed. Therefore, a dielectric structure including the first and the second dielectric layers may have improved dielectric characteristics and a leakage current through the dielectric structure may greatly decrease. Additionally, when the dielectric structure is employed as gate insulation layer and/or a dielectric layer of a volatile semiconductor memory device or a non-volatile semiconductor memory device, capacity and electrical characteristics of the semiconductor memory device may be improved. Since the dielectric structure includes at least one metal silicon oxide layer and at least one metal silicon oxynitride layer, the dielectric structure may have a good heat resistance and a high dielectric constant without being damaged in a heat treatment process. Therefore, the semiconductor memory device may have excellent electrical characteristics.

BRIEF DESCRIPTION OF THE DRAWINGS

The above and other features and advantages of the present invention will become more apparent by describing embodiments thereof with reference to the accompanying drawings, in which.

DESCRIPTION OF THE EMBODIMENTS

Figure 1:
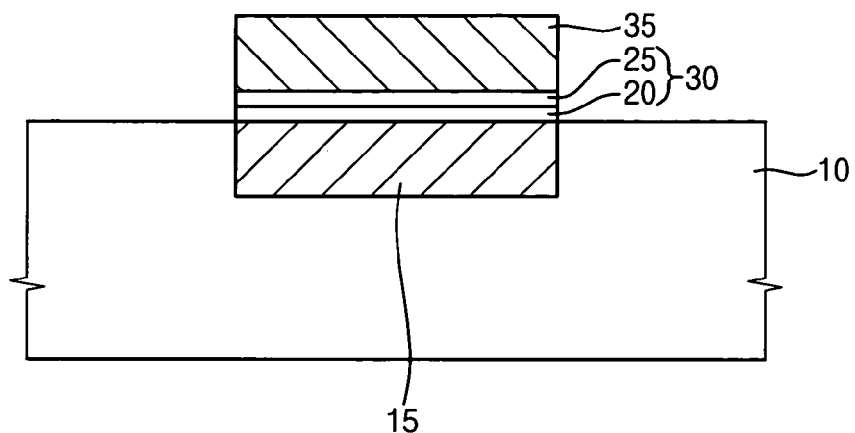
FIG. 1 is a cross-sectional view illustrating a dielectric structure in accordance with some embodiments of the present invention.

The present invention is described more fully hereinafter with reference to the accompanying drawings, in which some embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a dielectric structure in accordance with some embodiments of the present invention.

Referring to FIG. 1, a dielectric structure 30 including a first dielectric layer pattern 20 and a second dielectric layer pattern 25 is formed between a first conductive structure 15 and a second conductive structure 35.

The first conductive structure 15 includes a conductive region, a pad, a plug, a contact, a storage electrode of a capacitor and/or a floating gate. The first conductive structure 15 includes a conductive material such as polysilicon doped with impurities, a metal, a metal nitride and a metal silicide.

The second conductive structure 35 includes a pad, a contact, a plug, a gate electrode, a plate electrode of a capacitor and/or a control gate. The second conductive structure 35 also includes a conductive material such as polysilicon doped with impurities, a metal and a metal nitride.

The dielectric structure 30 having the first and the second dielectric layer patterns 20 and 25 includes a gate insulation layer or a dielectric layer of a volatile semiconductor memory device, or a dielectric layer of a non-volatile semiconductor memory device.

The first dielectric layer pattern 20 includes a metal oxide doped with silicon ($M_xSi_yO_2$), and the second dielectric layer pattern 25 includes a metal oxynitride doped with silicon ($M_xSi_yO_{2-z}N_z$) formed by treating the first dielectric layer pattern 20 with ammonia ($NH_3$) plasma or nitrogen ($N_2$) plasma. $X+Y=1$, $0 \leq X \leq 1$, $0 \leq Y \leq 1$ and $0 \leq Z \leq 1$. Here, a composition of the dielectric structure 30 is represented by $M_xSi_yO_2/M_xSi_yO_{2-z}N_z$. In some embodiments of the present invention, the dielectric structure 30 may have a construction in which the first dielectric layer pattern 20 and the second dielectric layer pattern 25 are alternately laminated. That is, the dielectric structure 30 may have composition of $[M_xSi_yO_2/M_xSi_yO_{2-z}N_z]_N$. Here, N is a positive integer.

The first dielectric layer pattern 20 may include a metal oxide containing transition metal in Group IV doped with silicon, a metal oxide containing transition metal in Group V doped with silicon or a metal oxide containing rare earth metal doped with silicon. The second dielectric layer pattern 25 formed from the first dielectric layer pattern 20 may include a metal oxynitride containing transition metal in Group IV doped with silicon, a metal oxynitride containing transition metal in Group V doped with silicon, or a metal oxynitride containing rare earth metal doped with silicon. For example, the first dielectric layer pattern 20 includes titanium oxide doped with silicon, zirconium oxide doped with silicon, hafnium oxide doped with silicon, vanadium oxide doped with silicon, niobium oxide doped with silicon, tantalum oxide doped with silicon, scandium oxide doped with silicon, yttrium oxide doped with silicon, lanthanum oxide doped with silicon, etc. For example, the second dielectric layer pattern 25 formed by treating the first dielectric layer pattern 20 with the plasma may include titanium oxynitride doped with silicon, zirconium oxynitride doped with silicon, hafnium oxynitride doped with silicon, vanadium oxynitride doped with silicon, niobium oxynitride doped with silicon, tantalum oxynitride doped with silicon, scandium oxynitride doped with silicon, yttrium oxynitride doped with silicon, lanthanum oxynitride doped with silicon, etc.

Hereinafter, a method of forming a dielectric structure in accordance with some embodiments of the present invention will be described in detail.

As shown in FIG. 1, the first conductive structure 15 is formed on a semiconductor substrate 10.

In some embodiments of the present invention, when the first conductive structure 15 has a contact region, the first conductive structure 15 is formed by implanting impurities into a predetermined portion of the semiconductor substrate 10 using an ion implantation process and a heat treatment process.

In some embodiments of the present invention, when the first conductive structure 15 includes a pad, a contact or a plug, after a first insulation layer having a first opening that exposes a predetermined portion of the semiconductor 10 is formed on the semiconductor substrate 10, a first conductive layer is formed on the first insulation layer to fill up the first opening. The first conductive layer is partially removed until the first insulation layer is exposed by a chemical mechanical polishing (CMP) process, an etch back process or a combination of CMP and etch back. Thus, the first conductive structure 15 including a first conductive layer pattern filling up the first opening is formed.

In some embodiments of the present invention, the first conductive structure 15 includes a storage electrode or a floating gate. After a pad or a tunnel oxide layer is formed on the semiconductor substrate 10, a first conductive layer is formed on the semiconductor substrate 10 to cover the pad or the tunnel oxide layer. The first conductive layer pattern is formed on the pad or the tunnel oxide layer by partially etching the first conductive layer, thereby forming the first conductive structure 15.

When the first conductive structure 15 includes doped polysilicon, after the first conductive layer including polysilicon or amorphous silicon is formed on the semiconductor substrate 10 by a CVD process, the first conductive layer is doped with impurities by a $POCl_3$ diffusion process, an ion implantation process or an in-situ doping process. The first conductive layer is partially etched by an etching process so that the first conductive structure 15 having the first conductive layer pattern is formed on the semiconductor substrate 10. The first conductive structure 15 formed on the semiconductor substrate 10 may have a thickness of about 10 Å to about 700 Å.

In FIG. 1, the first dielectric layer is formed on the semiconductor substrate 10 to cover the first conductive structure 15. The first dielectric layer is formed by a CVD process, an ALD process, a PVD process or a PLD process. Particularly, a metal layer doped with silicon is formed on the semiconductor substrate 10 to cover the first conductive structure 15. For example, the metal layer doped with silicon includes titanium, zirconium, hafnium, vanadium, niobium, tantalum, scandium, yttrium, lanthanum, etc. The metal layer doped with silicon is oxidized so that the first dielectric layer including metal oxide doped with silicon is formed on the semiconductor substrate 10.

Figure 2:
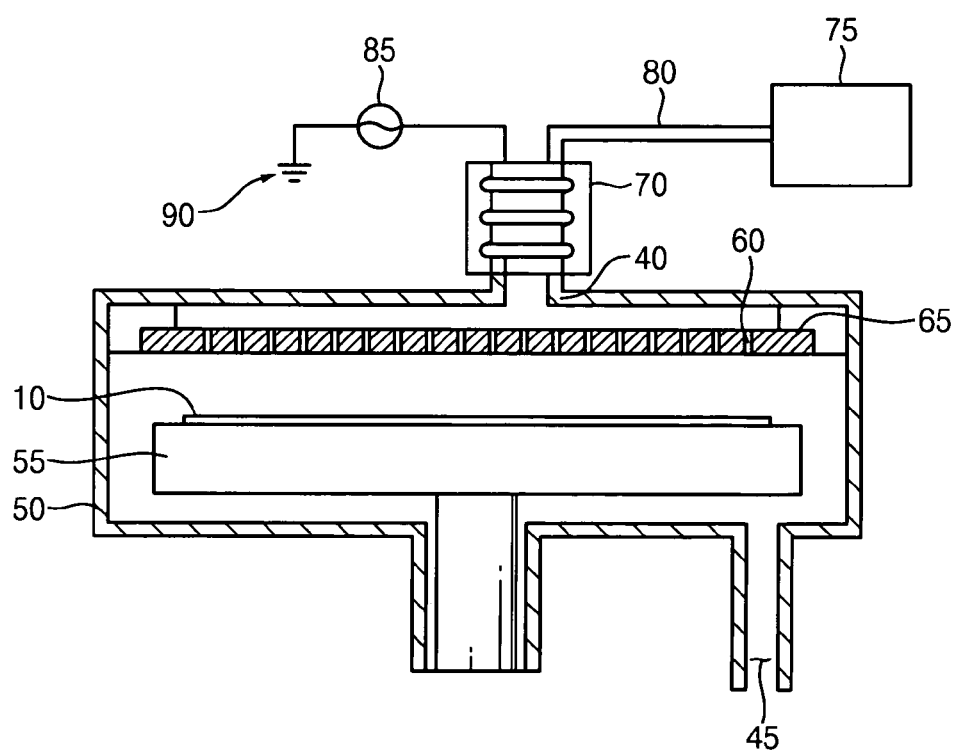
FIG. 2 is a cross-sectional view illustrating a plasma treatment apparatus for forming a dielectric structure in accordance with some embodiments of the present invention.

FIG. 2 is a cross-sectional view illustrating a plasma treatment apparatus for forming a dielectric structure in accordance with some embodiments of the present invention.

Referring to FIGS. 1 and 2, the plasma treatment apparatus includes a chamber 50 having a plasma induction pipe 40 and a gas outlet 45. The plasma induction pipe 40 is disposed at an upper portion of the chamber 50, and the gas outlet 45 is disposed at a lower portion of the chamber 50.

A susceptor 55 is installed in the chamber 50 to support the semiconductor substrate 10 having the first dielectric layer. A heater for heating the semiconductor substrate 10 to a predetermined temperature is disposed in the susceptor 55. A shower head 65 having a plurality of spray holes 60 is disposed over the susceptor 55. A plasma generator 70 for generating ammonia plasma or nitrogen plasma is connected to the chamber 50 through the plasma induction pipe 40.

Ammonia plasma or nitrogen plasma generated from the plasma generator 70 is provided onto the first dielectric layer formed on the semiconductor substrate 10 through the plasma induction pipe 40 and the spray holes 60 of the shower head 65. The plasma generator 70 is connected to a gas source 75 through a gas supply pipe 80. An ammonia gas or a nitrogen gas is introduced into the plasma generator 70 from the gas source 75 through the gas supply pipe 80 so as to generate ammonia plasma or nitrogen plasma.

A power source 85 supplies a high-frequency power or a direct current bias voltage into the plasma generator 70 so as to generate ammonia plasma or nitrogen plasma from the ammonia gas or the nitrogen gas. One end of the power source 85 is connected to the plasma generator 70, and the other end of the power source 85 is grounded.

The first dielectric layer formed on the semiconductor substrate 10 is treated with ammonia plasma or nitrogen plasma using the plasma treatment apparatus having the aforementioned construction. For example, the ammonia gas or the nitrogen gas is supplied from the gas source 75 into the plasma generator 70 at a flow rate of about 100 sccm to about 1,500 sccm. The high-frequency power of about 250 W to about 800 W or the direct current bias voltage may be applied to the plasma generator 70 from the power source 85 so that ammonia plasma or nitrogen plasma is generated from the ammonia gas or the nitrogen gas. Ammonia plasma or nitrogen plasma may be provided onto the first dielectric layer formed on the semiconductor substrate 10 through the spray holes 60 of the shower head 65 for about 60 sec to about 180 sec. The heater may heat the semiconductor substrate 10 to have a temperature of about 300° C. to about 900° C. Accordingly, an upper portion of the first dielectric layer is nitrated so that the second dielectric layer including metal oxynitride doped with silicon is formed on the first dielectric layer. The second dielectric layer may have a composition depending on that of the first dielectric layer. For example, the second dielectric layer includes titanium oxynitride doped with silicon, zirconium oxynitride doped with silicon, hafnium oxynitride doped with silicon, vanadium oxynitride doped with silicon, niobium oxynitride doped with silicon, tantalum oxynitride doped with silicon, scandium oxynitride doped with silicon, yttrium oxynitride doped with silicon, lanthanum oxynitride doped with silicon, etc.

Figure 3:
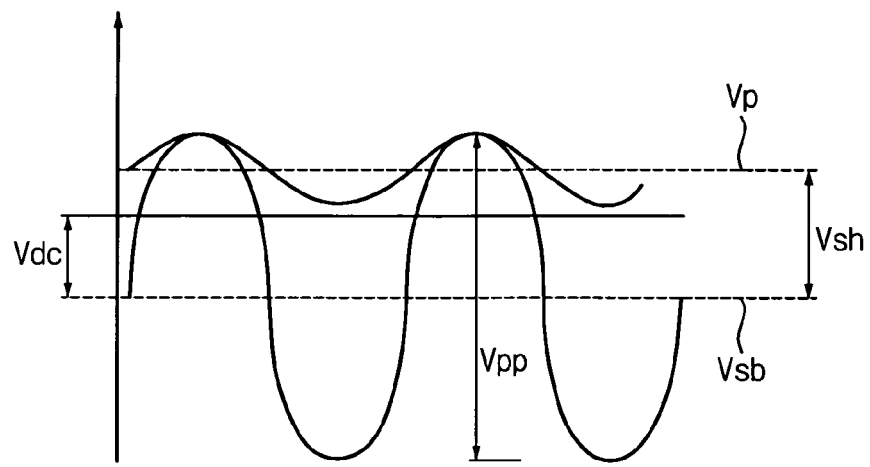
FIG. 3 is a graph illustrating a voltage difference between a wafer susceptor and a ground in a plasma treatment process according to some embodiments of the present invention.

FIG. 3 is a graph illustrating a voltage difference between a wafer susceptor and a ground in a plasma treatment process according to some embodiments of the present invention. In FIG. 3, "Vp" represents an average space potential of ammonia plasma or nitrogen plasma, and "Vpp" indicates a voltage difference between a susceptor 55 and a ground 90. In addition, "Vsh" means a sheath voltage of ammonia plasma or nitrogen plasma, "Vsb" indicates a substrate potential, and "Vdc" represents an applied bias voltage. In FIG. 3, Vpp may be obtained by a following equation.

$$Vpp=(Vp+Vdc)(2-Vp)=Vsh(2-Vp)$$

Figure 4:
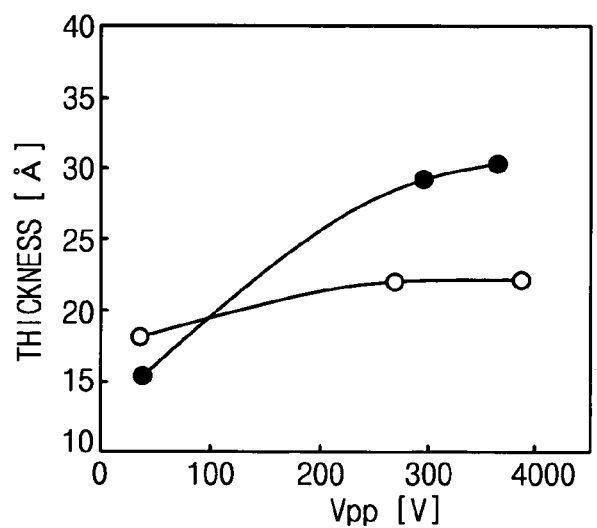
FIG. 4 is a graph showing a thickness variation of metal silicon oxynitride layers doped with silicon relative to a voltage difference between a susceptor and a ground when the metal silicon oxynitride layers are formed using ammonia plasma and using nitrogen plasma in accordance with an example embodiment of the present invention.

FIG. 4 is a graph showing thickness variations of metal silicon oxynitride layers doped with silicon relative to a voltage difference between a susceptor and a ground when the metal silicon oxynitride layers are formed using ammonia plasma and nitrogen plasma in accordance with some embodiments of the present invention. In FIG. 4, "●" represents a thickness variation of a first metal oxynitride layer doped with silicon treated with ammonia plasma with respect to Vpp, and "○" indicates a thickness variation of a second metal oxynitride doped with silicon treated with nitrogen plasma with respect to Vpp.

As shown in FIGS. 3 and 4, when the second metal oxynitride layer doped with silicon is formed on the metal oxide layer by nitrating the metal oxide layer doped with silicon with nitrogen plasma, a thickness of the second metal oxynitride doped with silicon may not increase as the voltage difference (Vpp) between the susceptor 55 and the ground 90 increases. However, when the first metal oxynitride layer doped with silicon is formed on the metal oxide layer by nitrating the metal oxide layer doped with silicon with ammonia plasma, a thickness of the first metal oxynitride doped with silicon may considerably increase as the voltage difference (Vpp) between the susceptor 55 and the ground 90 increases. When the voltage difference (Vpp) between the susceptor 55 and the ground 90 is less than about 100V, the second metal oxynitride layer doped with silicon may have a thickness substantially thicker than that of the first metal oxynitride layer doped with silicon. However, when the voltage difference (Vpp) between the susceptor 55 and the ground 90 is above about 100V, the first metal oxynitride layer doped with silicon may have a thickness substantially thicker than that of the second the metal oxynitride doped with silicon. That is, when a metal oxide layer doped with silicon is nitrated using ammonia plasma, the metal oxynitride layer doped with silicon having enough thickness may be obtained by increasing the voltage difference (Vpp) between the susceptor 55 and the ground 90.

Figure 5:
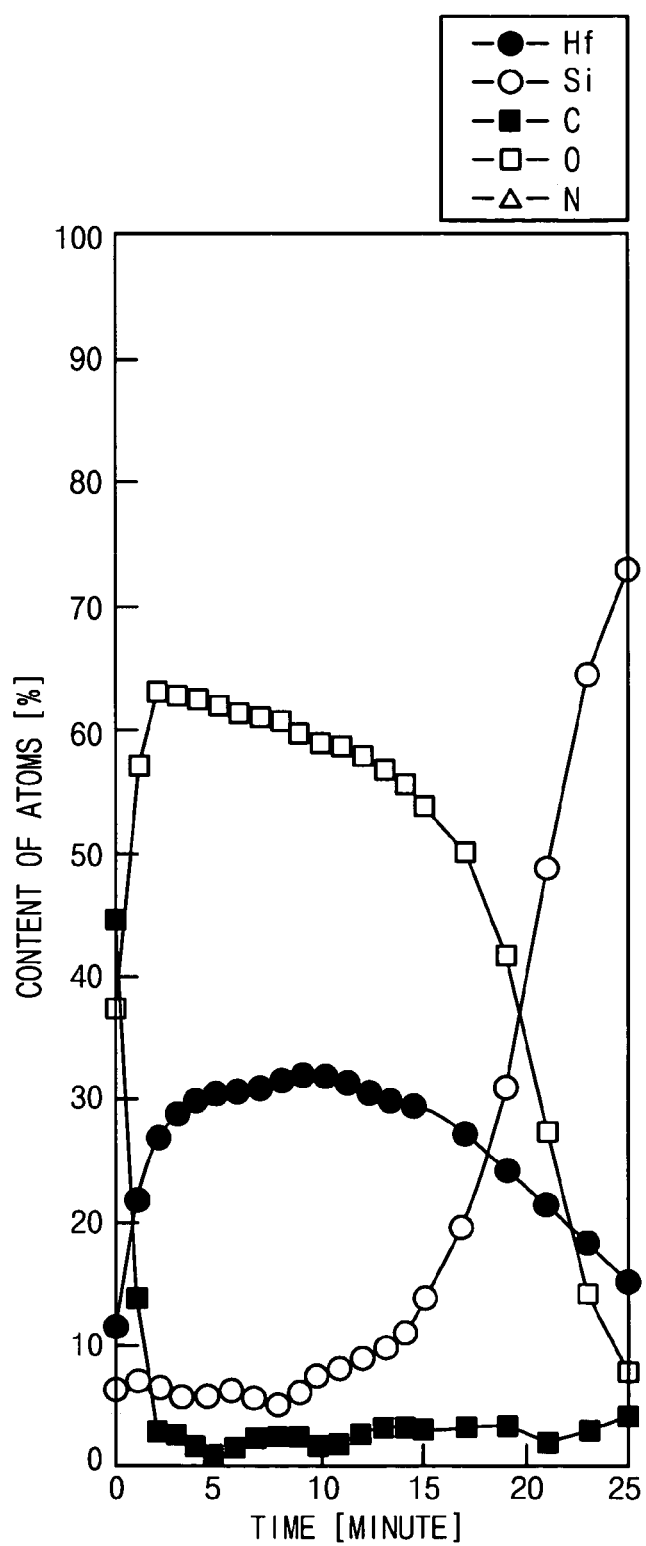
FIG. 5 is a graph illustrating contents of atoms included in a hafnium oxide layer doped with silicon.
Figure 6:
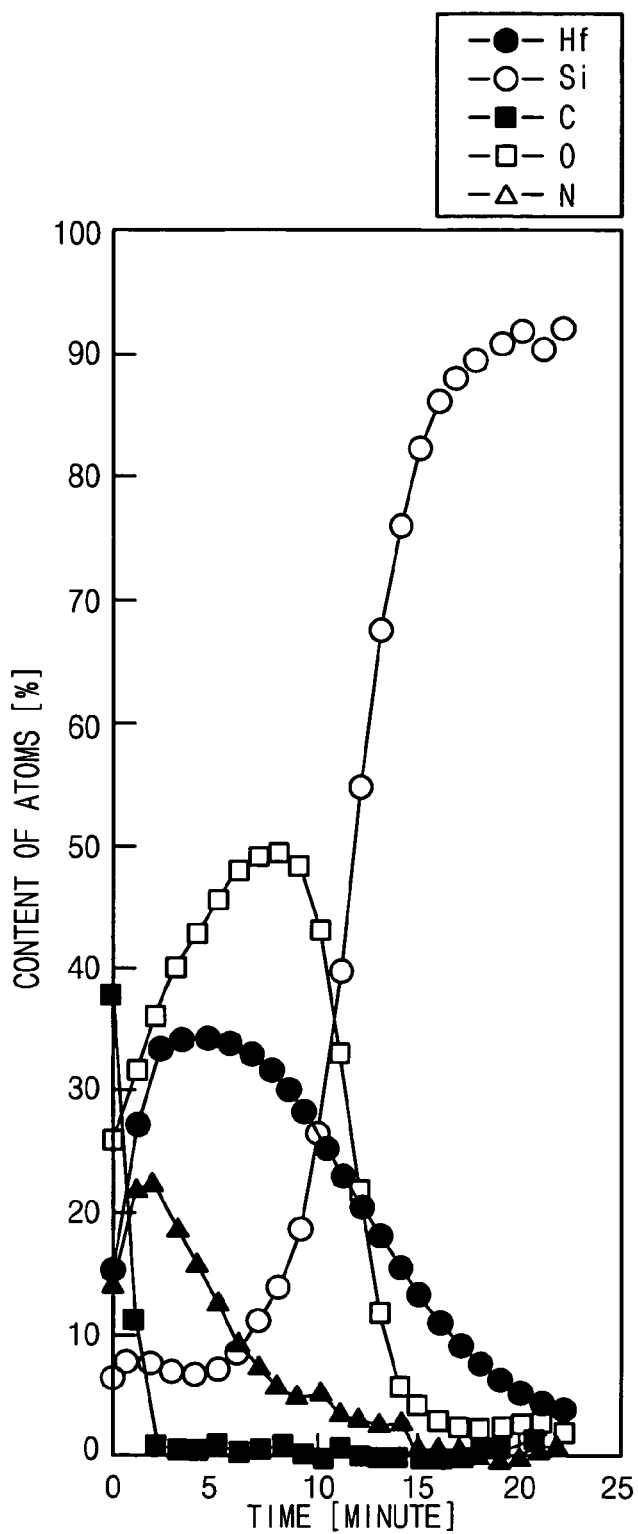
FIG. 6 is a graph illustrating contents of atoms included in a hafnium oxynitride layer doped with silicon treated with ammonia plasma.
Figure 7:
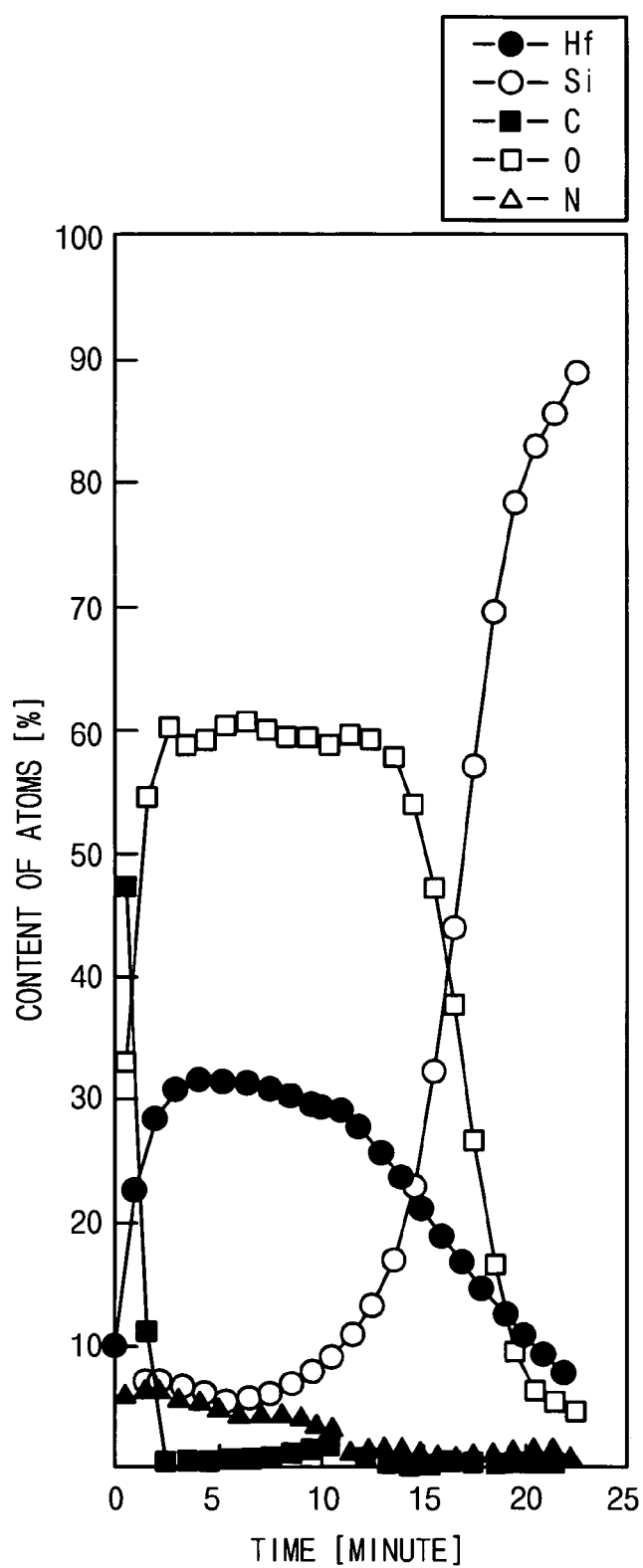
FIG. 7 is a graph illustrating contents of atoms contained in a hafnium oxide layer doped with silicon treated with nitrogen plasma.

FIG. 5 is a graph illustrating contents of atoms included in a hafnium oxide layer doped with silicon. FIG. 6 is a graph illustrating contents of atoms contained in a hafnium oxynitride layer doped with silicon treated with ammonia plasma. FIG. 7 is a graph illustrating contents of atoms included in a hafnium oxide layer doped with silicon treated with nitrogen plasma. In FIGS. 5 to 7, "●" indicates a content of hafnium atoms and "○" represents a content of silicon atoms. Additionally, "■" means a content of carbon atoms and "□" indicates a content of oxygen atoms. Further, "Δ" represents a content of nitrogen atoms.

As shown in FIGS. 5 to 7, after the hafnium oxide layers doped with silicon ($Hf_{0.75}Si_{0.25}O_2$) having thickness of about 40 Å to about 50 Å are formed by an ALD process, the hafnium oxynitride layers doped with silicon ($Hf_{0.75}Si_{0.25}O_{2-x}N_x$) are formed by nitrating the hafnium oxide layers doped with silicon through treatment processes of the hafnium oxide layers with ammonia plasma and nitrogen plasma. Compositions of the hafnium oxide layers doped with silicon and the hafnium oxynitride layers doped with silicon are analyzed by X-ray photoelectron spectroscopy to obtain the contents of the atoms included in the hafnium oxide layers and the hafnium oxynitride layers.

Referring to FIG. 5, after the metal oxide layer doped with silicon is formed on a substrate by an ALD process, the content of hafnium atoms in the metal oxide layer doped with silicon is about 30.0%. In addition, the content of silicon atoms in the metal oxide layer is about 7.8% and the content of oxygen atoms in the metal oxide layer is about 59.5%.

As shown in FIG. 6, when the metal oxynitride layer doped with silicon is formed by nitrating the metal oxide layer using ammonia plasma, the content of hafnium atoms in the metal oxynitride layer doped with silicon is about 32.4%, and the content of silicon atoms in the metal oxynitride layer is about 8.8%. Additionally, the content of oxygen atoms in the metal oxynitride layer is about 42.7% and a maximum content of nitrogen atoms in the metal oxynitride layer is about 22.0%.

Referring to FIG. 7, when the metal oxynitride layer doped with silicon was formed by nitrating the metal oxide layer doped with silicon using nitrogen plasma, the content of hafnium atoms in the metal oxynitride layer doped with silicon is about 29.7% and the content of silicon atoms in the metal oxynitride layer is about 8.0%. Further, the content of oxygen atoms in the metal oxynitride layer is about 58.8% and a maximum content of nitrogen atoms in the metal oxynitride layer is about 6.0%.

As shown in FIGS. 5 to 7, when the voltage difference (Vpp) between the susceptor and the ground is below 50V, all the hafnium oxynitride layers doped with silicon formed using nitrogen plasma and ammonia plasma have the contents of nitrogen atoms less than about 2%. However, when the voltage difference (Vpp) between the susceptor and the ground is above 400V, the maximum contents of nitrogen atoms in the hafnium oxynitride layers formed using nitrogen plasma are about 6% whereas the hafnium oxynitride layers formed using ammonia plasma have a greatly increased maximum contents of nitrogen atoms of about 22%. Therefore, when the hafnium oxynitride layer doped with silicon is formed by treating the hafnium oxide layer doped with silicon with ammonia plasma, the metal oxynitride layer doped with silicon may have a sufficient thickness on the hafnium oxide layer.

Referring now to FIG. 1, a first dielectric layer pattern 20 and a second dielectric layer pattern 25 are sequentially formed on the first conductive structure 15 by etching a first dielectric layer and a second dielectric layer. Thus, a dielectric structure 30 is completed on the first conductive structure 15.

A second conductive structure 35 is formed on the dielectric structure 30. When the second conductive structure 35 includes a pad or a plug, after a second insulation layer having a second opening that partially exposes the dielectric structure 30 is formed on the dielectric structure 30, a second conductive layer is formed on the second insulation layer to fill up the second opening. The second conductive layer is removed by a CMP process, an etch back process or a combination of CMP and etch back process until the second insulation layer is exposed. Thus, the second conductive structure 35 including a second conductive layer pattern filling up the second opening is formed on the dielectric structure 30.

When the second conductive structure 35 includes a plate electrode or a control gate, after a second conductive layer is formed on the dielectric structure 30, the second conductive layer is partially etched to form the second conductive layer pattern, thereby completing the second conductive structure 35 on the dielectric structure 30.

As described above, when the second conductive structure 35 includes doped polysilicon, after a second conductive layer including polysilicon or amorphous silicon is formed on the dielectric structure 30 by a CVD process, the second conductive layer is doped with impurities by a POCl$_3$ diffusion process, an ion implantation process or an in-situ doping process. Then, the second conductive layer is partially etched to thereby form the second conductive structure 35 having a second conductive layer pattern on the dielectric structure 30.

Hereinafter, a method of manufacturing a semiconductor device including a dielectric structure will be described in detail.

FIGS. 8A to 8E are cross-sectional views illustrating a method of manufacturing a volatile semiconductor memory device in accordance with some embodiments of the present invention.

Figure 8A:
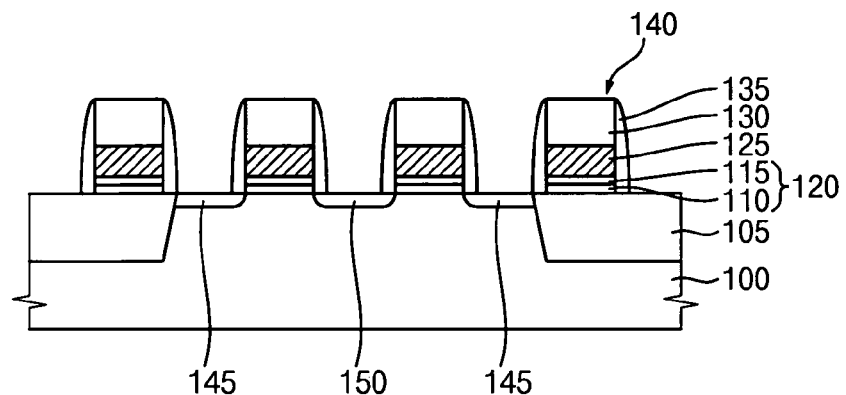
FIGS. 8A to 8E are cross-sectional views illustrating a method of manufacturing a volatile semiconductor memory device in accordance with some embodiments of the present invention.

Referring to FIG. 8A, a semiconductor substrate 100 is divided into an active region and a field region as an isolation layer 105 is formed at an upper portion of the semiconductor substrate 100 by a shallow trench isolation (STI) process.

A first dielectric layer including a metal oxide doped with silicon is formed on the semiconductor substrate 100 by a CVD process, an ALD process, a PVD process or a PLD process.

A second dielectric layer including a metal oxynitride doped with silicon is formed on the first dielectric layer by treating the first dielectric layer with a first plasma such as ammonia plasma or nitrogen plasma. The processes for forming the first and the second dielectric layers are substantially the same as those described above. That is, after the semiconductor substrate 100 having the first dielectric layer is loaded on the susceptor of the chamber, the second dielectric layer is formed on the first dielectric layer by treating the first dielectric layer with the first plasma while maintaining a voltage difference between the susceptor and the ground using the power source.

A first conductive layer and a first mask layer are sequentially formed on the second dielectric layer in order. The first conductive layer may be formed using polysilicon doped with impurities, a metal or a metal silicide. The first mask layer may be formed using a nitride such as silicon nitride.

After a first photoresist pattern (not shown) is formed on the first mask layer, a gate mask 130 is formed on the first conductive layer by partially etching the first mask layer using the first photoresist pattern as an etching mask.

A gate structure 140 is formed on the semiconductor substrate 100 by partially etching the first conductive layer, the second dielectric layer and the first dielectric layer using the gate mask 130 as an etching mask. The gate structure 140 includes a first dielectric structure 120, a gate electrode 125 and the gate mask 130. The first dielectric structure 120 includes a first dielectric layer pattern 110 and a second dielectric layer pattern 115 sequentially formed on the semiconductor substrate 100. In an example embodiment, the processes of forming the first and the second dielectric layers may be repeatedly performed N (N is a positive integer) times so that the first dielectric structure 120 including N numbers of the first dielectric layer patterns 110 and the second dielectric layer patterns 115 may be formed on the semiconductor substrate 100.

After a first insulation layer is formed on the semiconductor substrate 100 having the gate structure 140 using a nitride such as silicon nitride, a gate spacer 135 is formed on a sidewall of the gate structure 140 by anisotropically etching the first insulation layer.

After impurities are implanted into portions of the semiconductor substrate 100 exposed between the gate structures 140 by an ion implantation process using the gate structures 140 as implantation masks, a thermal treatment process is executed at about the semiconductor substrate 100 so that a first contact region 145 and a second contact region 150 are formed. The first contact region 145 and the second contact region 150 may correspond to a source region and a drain region, respectively. Therefore, an MOS transistor including the first and the second contact regions 145 and 150, the first dielectric structure 120 and the gate structure 140 is formed on the semiconductor substrate 100.

Figure 8B:
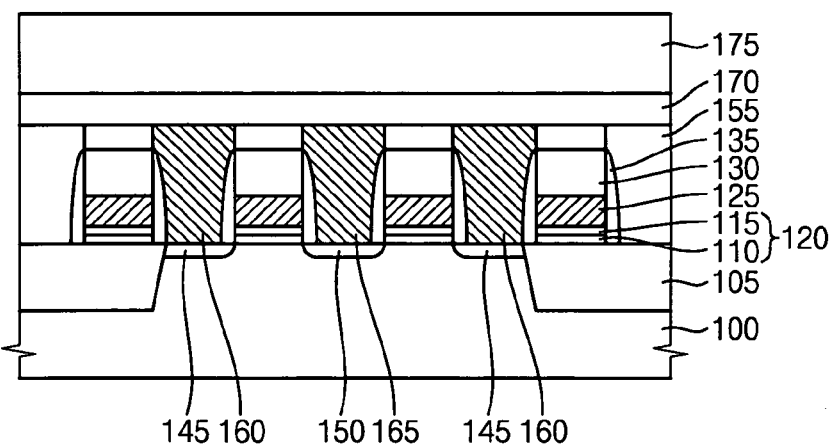

Referring to FIG. 8B, after a first insulating interlayer 155 including an oxide is formed on the semiconductor substrate 100 to cover the MOS transistor, the first insulating interlayer 155 is partially removed by a CMP process, an etch back process or a combination process of CMP and etch back, thereby planarizing the first insulating interlayer 155.

After a second photoresist pattern (not shown) is formed on the first insulating interlayer 155, the first insulating interlayer 155 is partially etched using the second photoresist pattern as an etching mask so that first contact holes exposing the first and the second contact regions 145 and 150 are formed through the first insulating interlayer 155. In an example embodiment of the present invention, some of the first contact holes may expose the first contact region 145 corresponding to a capacitor contact region whereas another first contact hole exposes the second contact region 150 corresponding to a bit line contact region.

After the second photoresist pattern is removed, a second conductive layer is formed on the first insulating interlayer 155 to fill up the first contact holes. The second conductive layer may be formed using polysilicon doped with impurities, a metal nitride such as titanium nitride, or a metal such as tungsten or copper.

The second conductive layer is partially removed by a CMP process, an etch back process or a combination process of CMP and etch back until the first insulating interlayer 155 is exposed. Thus, a first pad 160 and a second pad 165 corresponding to self-aligned contact (SAC) pads are formed through the first insulating interlayer 155. The first and the second pads 160 and 165 fill up the first contact holes, respectively. The first pad 160 makes contact with the first contact region 145 corresponding to the capacitor contact region, and the second pad 165 makes contact with the second contact region 150 corresponding to the bit line contact region.

After a second insulating interlayer 170 is formed on the first insulating interlayer 155 and the first and the second pads 160 and 165 using an oxide, a third photoresist pattern (not shown) is formed on the second insulating interlayer 170. The second insulating interlayer 170 is partially etched using the third photoresist pattern as an etching mask, thereby forming a second contact hole exposing the second pad 165 through the second insulating interlayer 170.

After the third photoresist pattern is removed, a third conductive layer and a second mask layer are sequentially formed on the second insulating layer 170 to fill up the second contact hole.

After a fourth photoresist pattern (not shown) is formed on the second mask layer, the second mask layer and the third conductive film are etched using the fourth photoresist pattern as an etching mask. Hence, a third pad filling up the second contact hole is formed through the second insulating interlayer 170, and a bit line (now shown) including a bit line conductive pattern and a bit line mask is simultaneously formed on the second insulting interlayer 170. The bit line conductive pattern may include a first film of metal and a second film of metal compound. The bit line mask may include a nitride such as silicon nitride.

After a second insulation layer (not shown) is formed on the bit line and the second insulating interlayer 170, the second insulation layer is etched to form a bit line spacer on a sidewall of the bit line. The bit line spacer is formed using a nitride such as a silicon nitride.

After a third insulating interlayer 175 is formed on the second insulating interlayer 170 using an oxide to cover the bit line having the bit line spacer, the third insulating interlayer 175 is partially removed by a CMP process, an etch back process or a combination process of CMP and etch back until the bit line is exposed, thereby planarizing the third insulating interlayer 175.

Figure 8C:
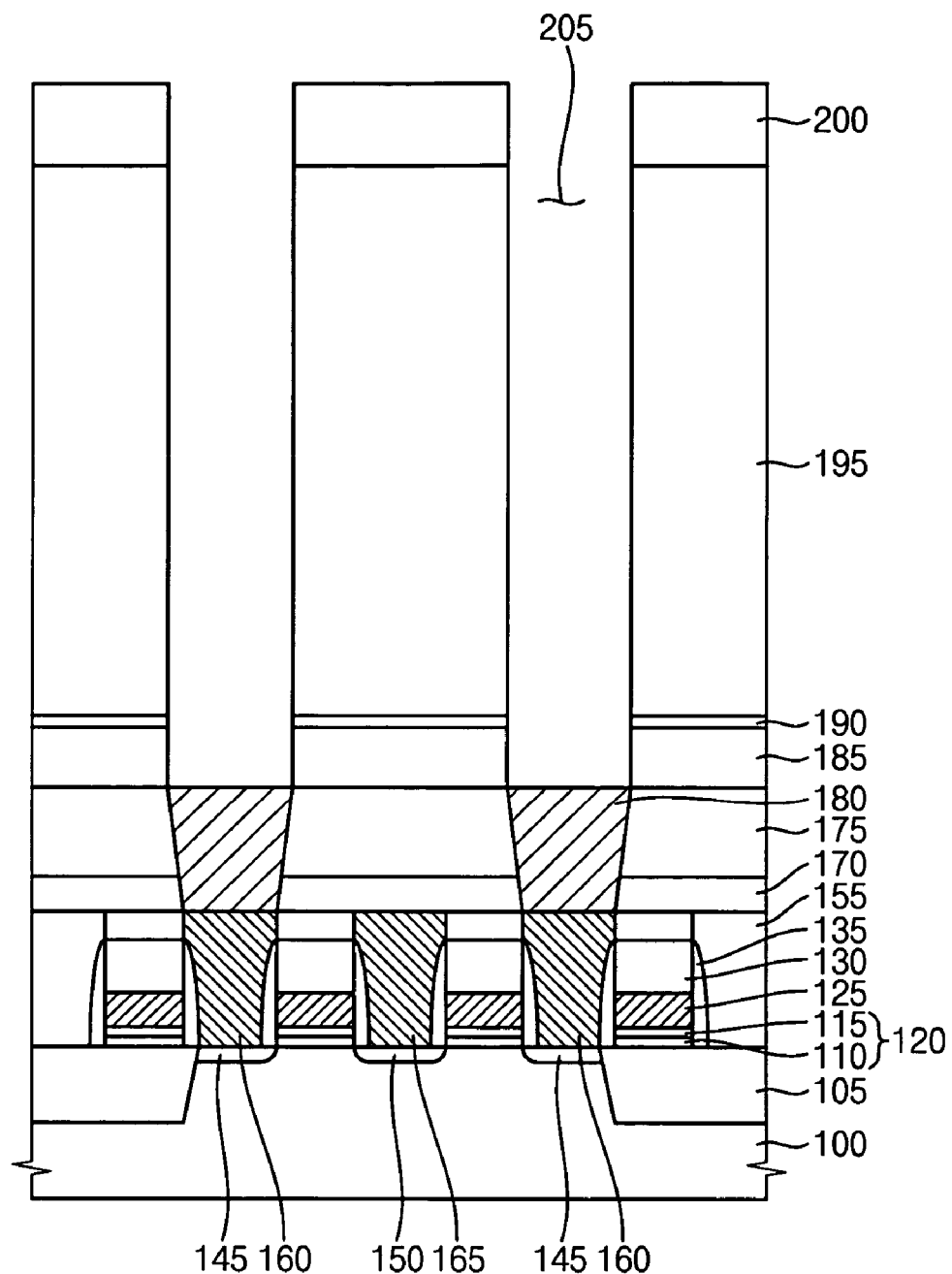

Referring to FIG. 8C, after a fifth photoresist pattern (not shown) is formed on the third insulating interlayer 175, the third insulating interlayer 175 and the second insulating interlayer 170 are partially etched using the fifth photoresist pattern as an etching mask. Thus, a third contact hole exposing the first pad 160 is formed through the third insulating interlayer 175 and the second insulating interlayer 170.

After a fourth conductive layer is formed on the third insulating interlayer 175 to fill up the third contact hole, the fourth conductive layer is partially removed by a CMP process, an etch back process or a combination process of CMP and etch back until the third insulating interlayer 175 and the bit line are exposed. Hence, a fourth pad 180 is formed in the third contact hole. The fourth pad 180 may be formed using polysilicon doped with impurities or a metal.

After a fourth insulating interlayer 185 is formed on the fourth pad 180, the bit line and the third insulating interlayer 175 using an oxide, an etch stop layer 190 is formed on the fourth insulating interlayer 185. The etch stop layer 190 may be formed using a nitride such as silicon nitride.

Figure 8D:
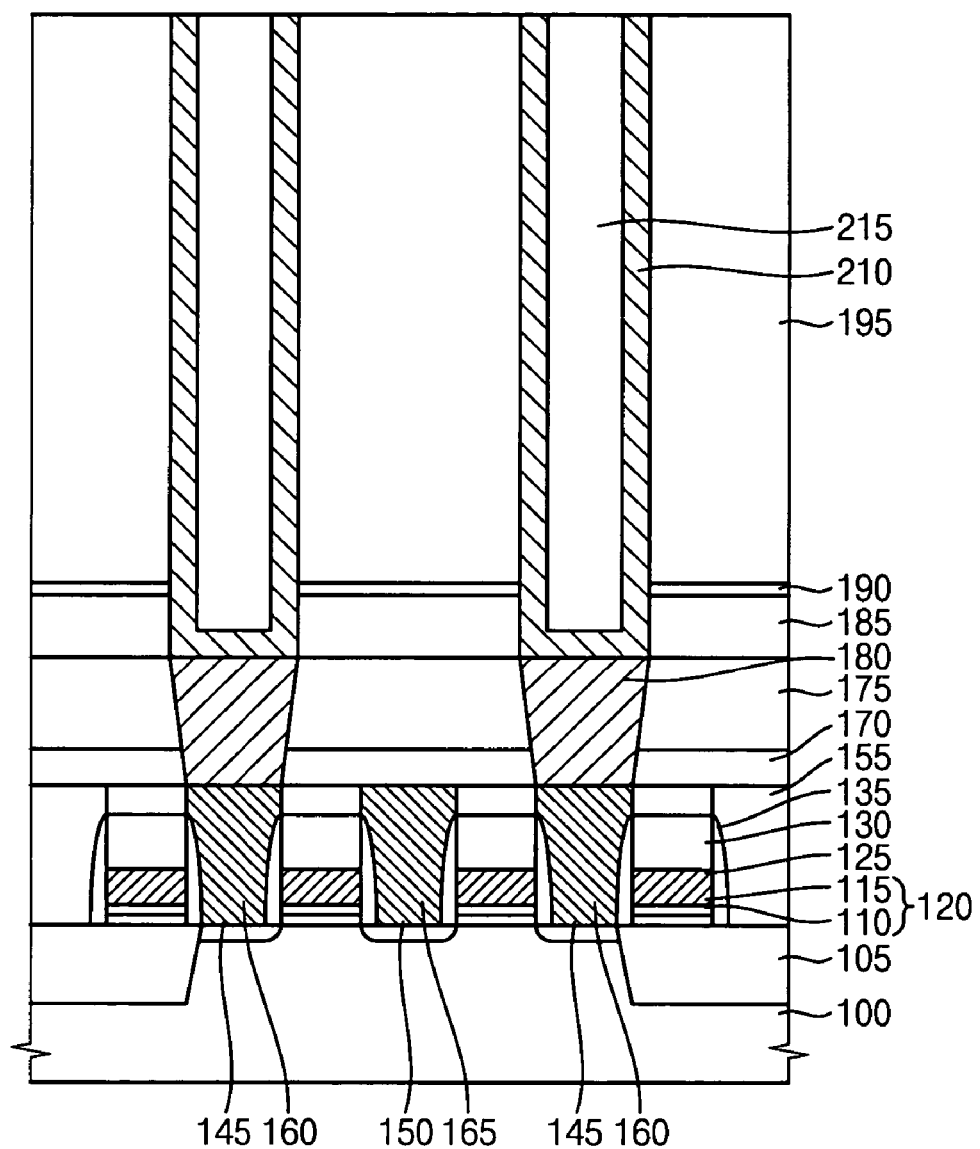

A mold layer 195 is formed on the etch stop layer 190 so as to form a storage electrode 210 (see FIG. 8D). The mold layer 195 may be formed using TEOS, HDP-CVD oxide, PSG, USG, BPSG, SOG, etc.

After a third mask layer is formed on the mold layer 195 using polysilicon or silicon nitride, a sixth photoresist pattern (not shown) is formed on the third mask layer. The third mask layer is partially etched using the sixth photoresist pattern as an etching mask so that a storage mask 200 is formed on the mold layer 195.

After the sixth photoresist pattern is removed, the mold layer 195, the etch stop layer 190 and the fourth insulating interlayer 185 are partially etched in order, thereby forming a fourth contact hole 205 that exposes the fourth pad 180.

Referring to FIG. 8D, after a fifth conductive layer is formed on the fourth pad 180, a sidewall of the fourth contact hole 205 and the storage mask 200 using polysilicon doped with impurities or a metal, a sacrificial layer is formed on the fifth conductive layer to fill up the fourth contact hole 205.

The sacrificial layer, the fifth conductive layer and the storage mask 200 are partially removed by a CMP process, an etch back or a combination process of CMP and etch back until the mold layer 195 is exposed. Thus, a sacrificial layer pattern 215 and the storage electrode 210 are formed. The sacrificial layer pattern 215 fills up the fourth contact hole 205.

Figure 8E:
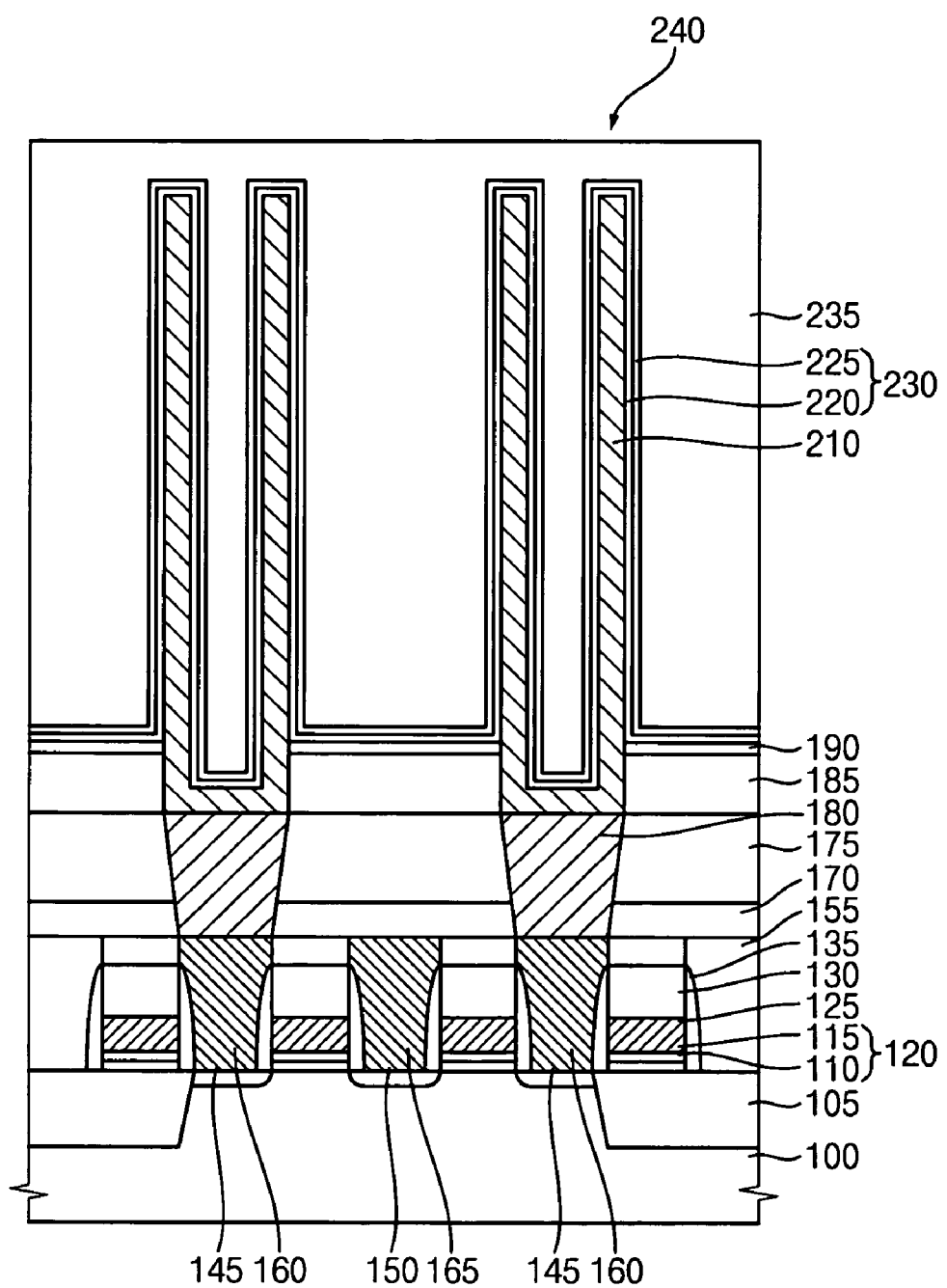

Referring to FIG. 8E, after the storage electrode 210 is exposed by removing the sacrificing layer pattern 215 and the mold layer 195, a third dielectric layer 220 is formed on the exposed storage electrode 210. The third dielectric layer 220 may be formed by a process substantially same as the above described process. A fourth dielectric layer 225 including a metal oxide doped with silicon is formed on the third dielectric layer 220 by treating the third dielectric layer 220 with a second plasma such as ammonia plasma or nitrogen plasma so that a second dielectric structure 230 enclosing the storage electrode 210 is formed. Particularly, after the semiconductor substrate 100 having the third dielectric layer 220 is placed on the susceptor in the chamber, the third dielectric layer 220 is treated using the second plasma while maintaining a second voltage difference between the susceptor and the ground in a range of about 300V to 500V. Thus, the fourth dielectric layer 225 is formed on the third dielectric layer 220 to complete the second dielectric structure 230.

According to some embodiments of the present invention, the processes of forming the third and the fourth dielectric layers may be repeatedly performed N(N is a positive integer) times so that the second dielectric structure 230 including N numbers of the third and the fourth dielectric layers 220 and 225 may be formed to enclose the storage electrode 210.

A capacitor 240 is formed over the semiconductor substrate 100 through forming a plate electrode 235 on the second dielectric structure 230 using doped polysilicon, a metal or a metal nitride. The volatile semiconductor device is formed on the semiconductor substrate 100 when an upper wiring and an additional insulating layer are formed on the capacitor 240.

Figure 9A:
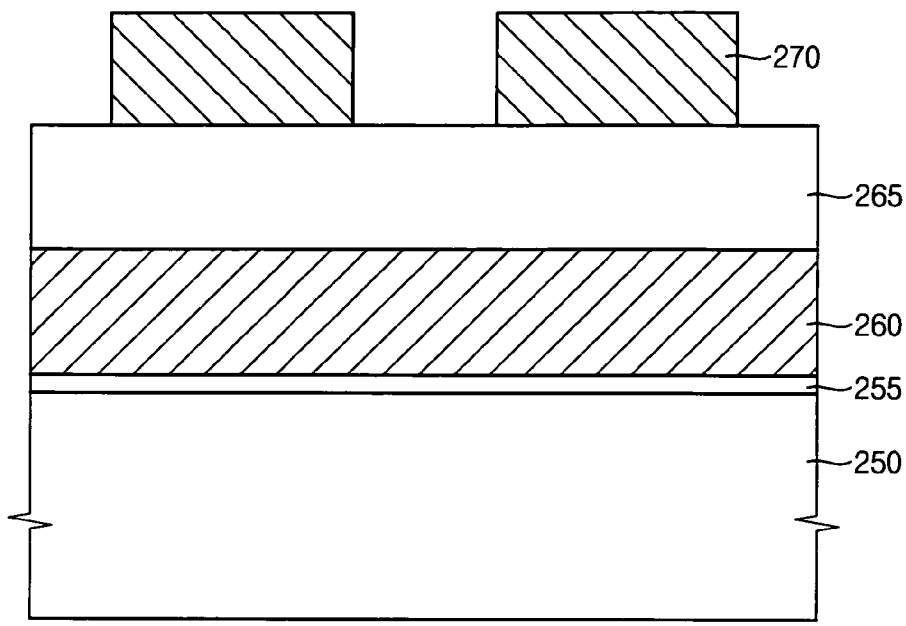
FIGS. 9A to 9H are cross-sectional views illustrating a method of manufacturing a non-volatile semiconductor memory device in accordance with some embodiments of the present invention.
Figure 9B:
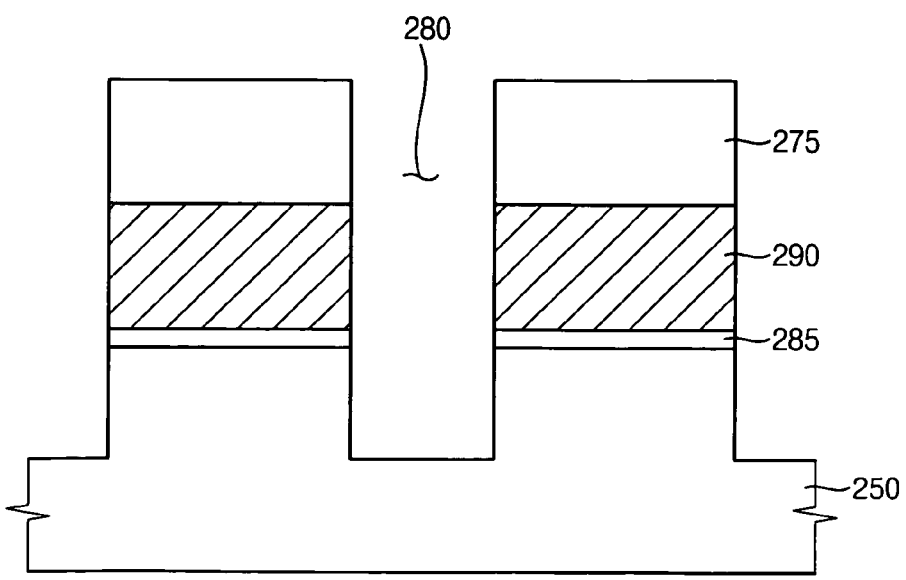
Figure 9C:
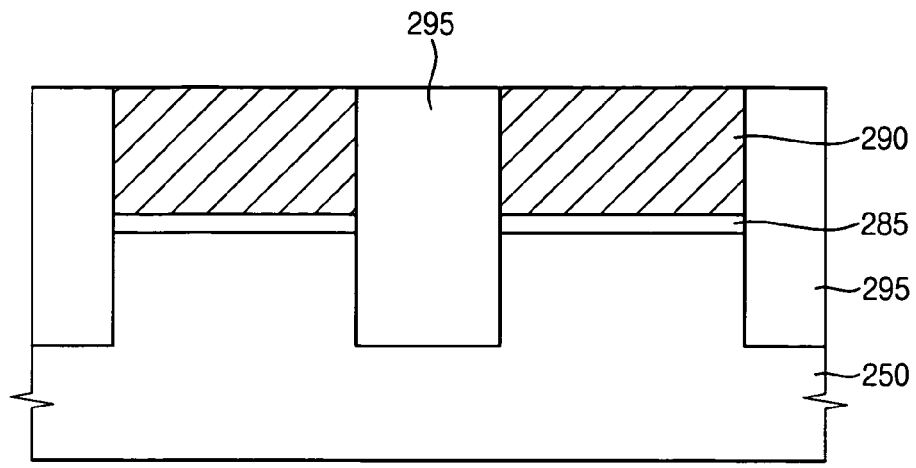
Figure 9D:
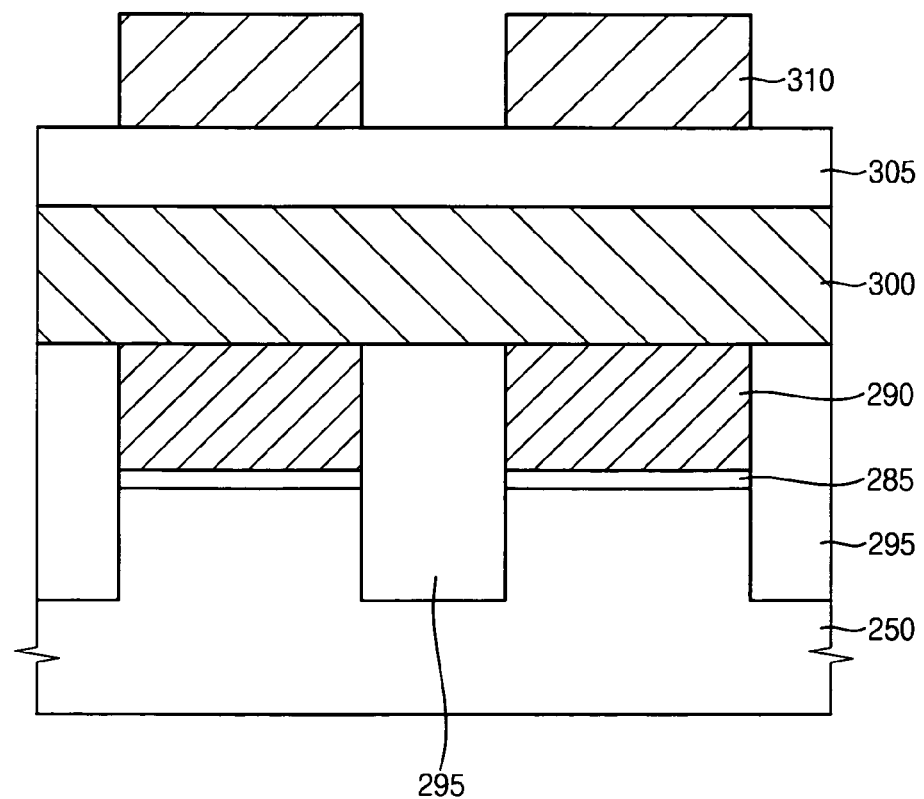
Figure 9E:
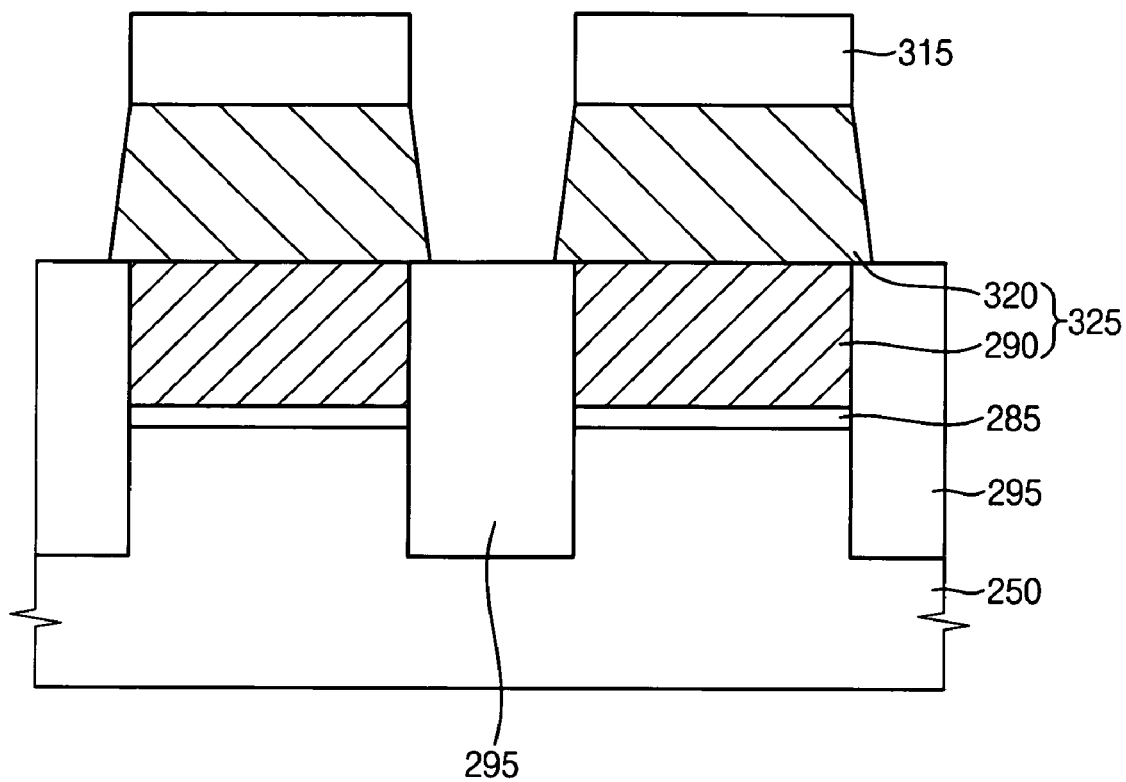
Figure 9F:
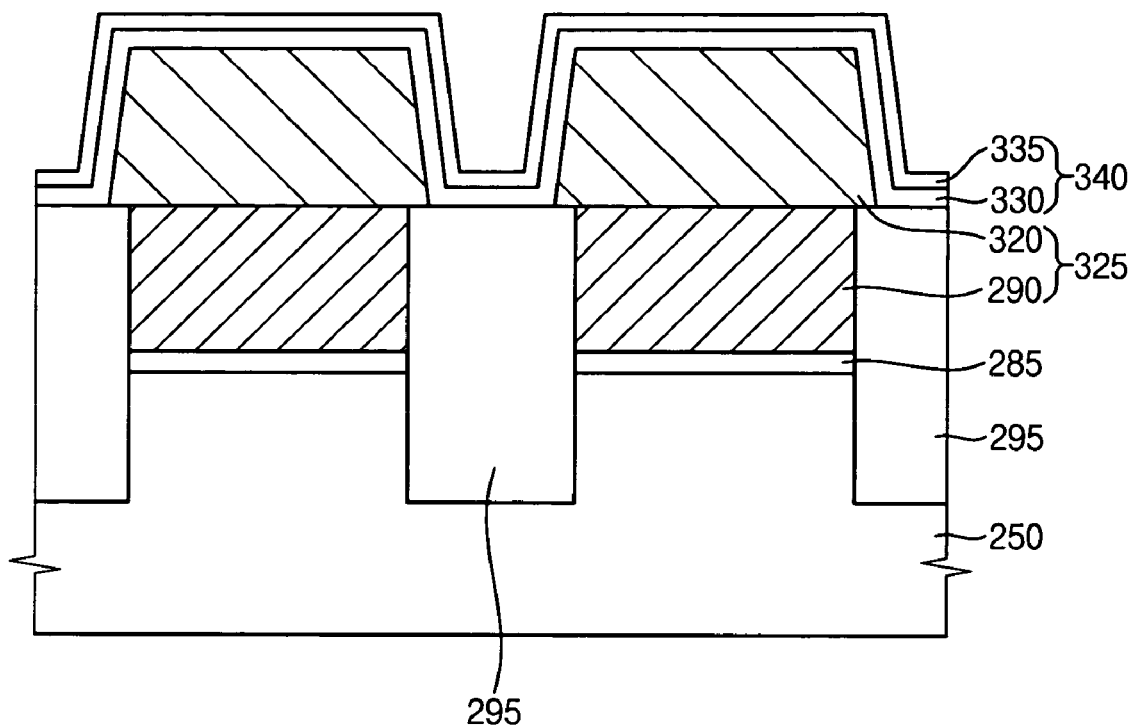
Figure 9G:
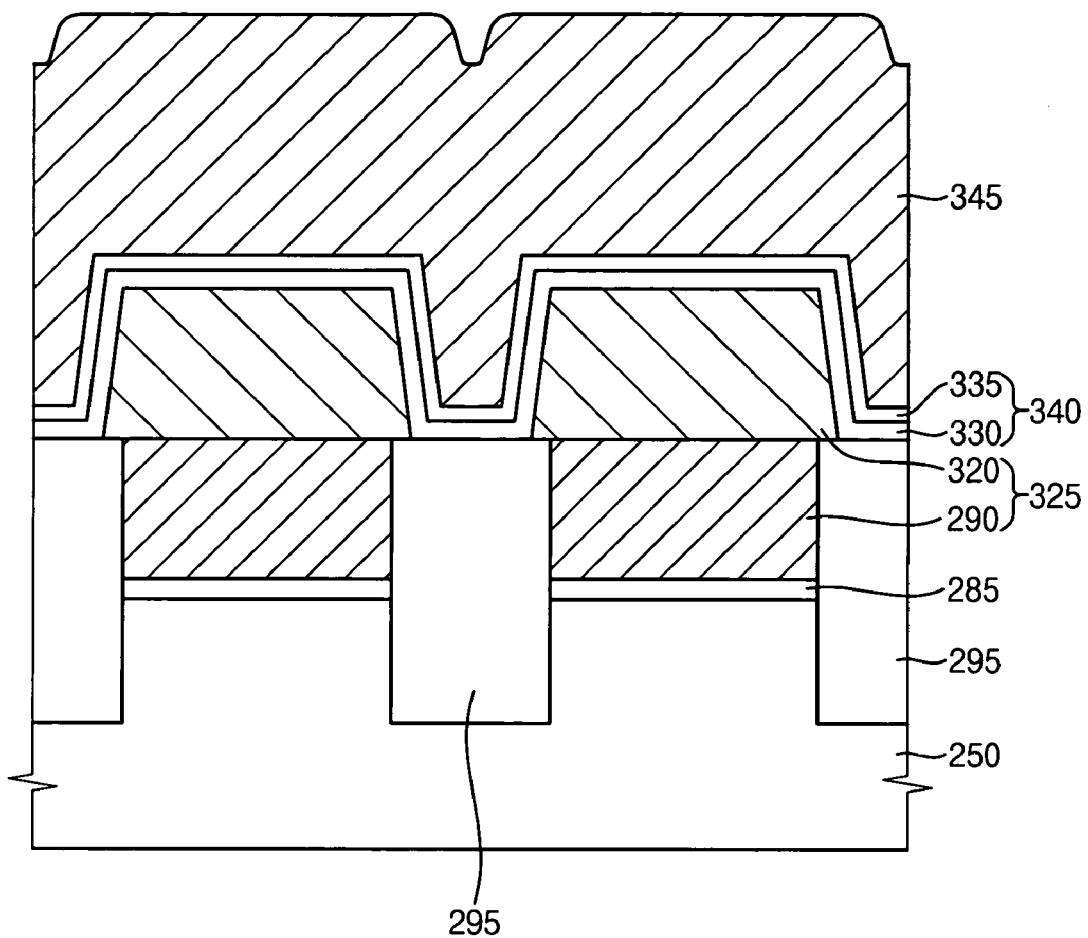
Figure 9H:
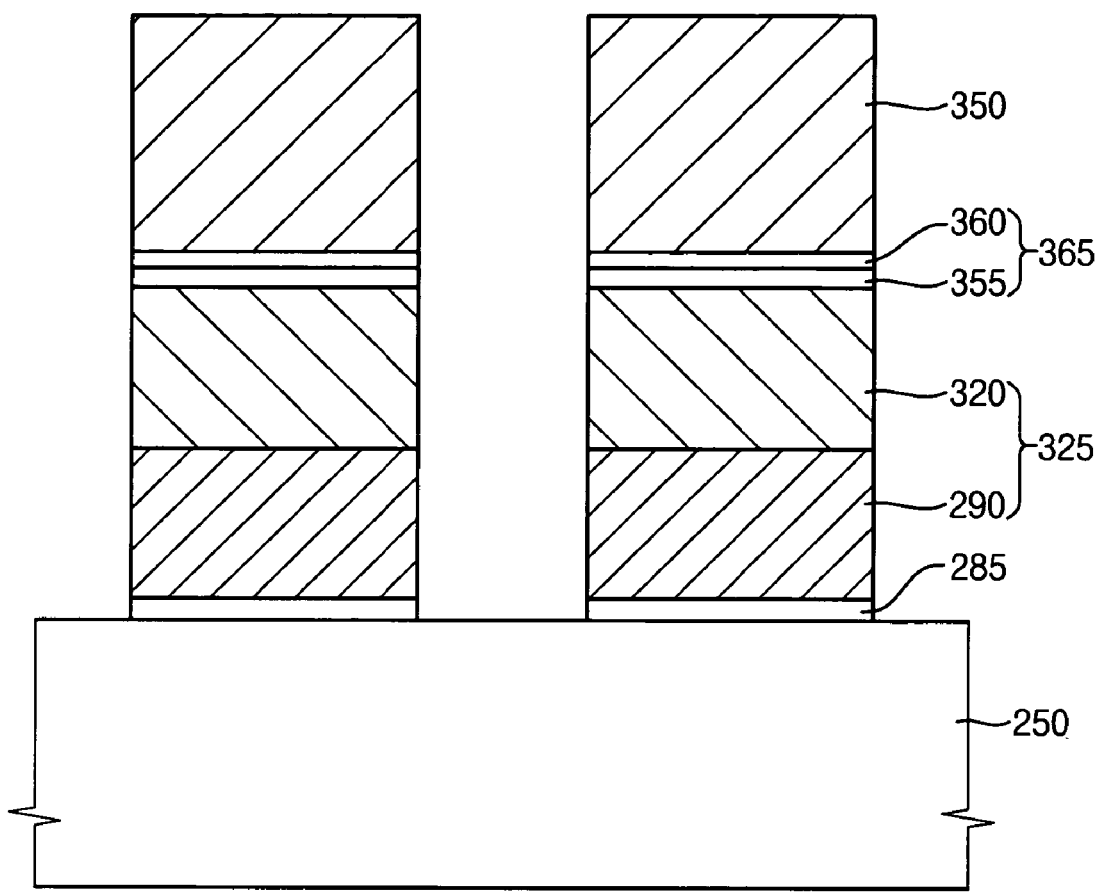

FIGS. 9A to 9H are cross-sectional views illustrating a method of manufacturing a non-volatile semiconductor memory device in accordance with some embodiments of the present invention. FIGS. 9A to 9G are cross-sectional views illustrating the non-volatile semiconductor memory device along a first direction perpendicular to an isolation layer. FIG. 9H is a cross-sectional view illustrating the non-volatile semiconductor memory device taken along a second direction parallel to the isolation layer.

Referring to FIG. 9A, after a tunnel oxide layer 255 is formed on a semiconductor substrate 250 such as a silicon wafer by a thermal oxidation process or a CVD process, a first conductive layer 260 including doped polysilicon is formed on the tunnel oxide layer 255 by a CVD process.

After a first hard mask layer 265 is formed on the first conductive layer 260 using silicon nitride or silicon oxynitride by a CVD process, a first photoresist pattern 270 is formed on the first hard mask layer 265.

Referring to FIG. 9B, the first hard mask layer 265 is partially etched using the first photoresist pattern 270 as an etching mask so that a first hard mask 275 is formed on the first conductive layer 260 in order to form a trench 280 and a first conductive layer pattern 285.

After the first photoresist pattern 270 is removed, the first conductive layer 260 and the tunnel oxide layer 255 are etched using the first hard mask 275 as an etching mask to thereby form a first conductive layer pattern 290 and a tunnel oxide layer pattern 285 on the semiconductor substrate 250.

A portion of the semiconductor substrate 250 exposed by the first conductive layer pattern 290 and the tunnel oxide layer pattern 285 is etched so that the trench 280 is formed at an upper portion of the semiconductor substrate 250.

Referring to FIG. 9C, after an insulation layer is formed on the semiconductor substrate 250 to fill up the trench 280, the insulation layer is partially removed by a CMP process, an etch back process or a combination process of CMP and etch back. Thus, an isolation layer 295 filling up the trench 280 is formed at the upper portion of the semiconductor substrate 250.

Referring to FIG. 9D, a second conductive layer 300 and a second hard mask layer 305 are sequentially formed on the first conductive layer pattern 290 and the isolation layer 295 in order. The second conductive layer 300 may be formed using doped polysilicon and the second hard mask layer 305 may be formed using silicon nitride or silicon oxynitride.

A second photoresist pattern 310 is formed on the second hard mask layer 305.

Referring to FIG. 9E, the second hard mask layer 305 is partially etched using the second photoresist pattern 310 as an etching mask to form a second hard mask 315 on the second conductive layer 300. After the second photoresist pattern 310 is removed, the second conductive layer 300 is partially etched using the second hard mask 315 as an etching mask. Hence, a second conductive layer pattern 320 is formed on the first conductive layer pattern 290. The second conductive layer pattern 320 may have a width slightly wider than that of the first conductive layer pattern 290.

When the second hard mask 315 is removed from the second conductive layer pattern 320, a floating gate 325 is formed on the tunnel oxide layer pattern 285. The floating gate 325 includes the first and the second conductive layer patterns 290 and 320 sequentially formed on the tunnel oxide layer pattern 285.

Referring to FIG. 9F, a first dielectric layer 330 including a metal oxide doped with silicon is formed on the isolation layer 295 and the second conductive layer pattern 320 of the floating gate 325.

A second dielectric layer 335 is formed on the first dielectric layer 330 by treating the first dielectric layer 330 with nitrogen plasma or ammonia plasma so that a preliminary dielectric structure 340 is formed on the floating gate 325. The preliminary dielectric structure 340 includes the first dielectric layer 330 and the second dielectric layer 335. Particularly, after the semiconductor substrate 250 having the first dielectric layer 330 is loaded on a susceptor in a chamber, the first dielectric layer 330 is treated with the plasma while maintaining a voltage difference between the susceptor and a ground in a range of about 300V to about 500V. Thus, the second dielectric layer 335 is formed on the first dielectric layer 330. In one example embodiment of the present invention, formations of the first and the second dielectric layers 330 and 335 on the floating gate 325 and the isolation layer 295 may be repeatedly performed. Hence, the preliminary dielectric structure 340 may include N numbers of the first and the second dielectric layers 330 and 335.

Referring to FIG. 9G, a third conductive layer 345 is formed on the preliminary dielectric structure 340 using doped polysilicon, a metal or a metal silicide. Here, the third conductive layer 345 is formed to cover the preliminary dielectric structure 340.

Referring to FIG. 9H, after a third photoresist pattern (not shown) is formed on the third conductive layer 345, the third conductive layer 345 and the preliminary dielectric structure 340 are partially etched using the third photoresist pattern as an etching mask. Therefore, a dielectric structure 365 and a control gate 350 are sequentially formed on the floating gate 325. The dielectric structure 365 includes a first dielectric pattern 355 and a second dielectric pattern 360 formed between the floating gate 325 and the control gate 350. Accordingly, the non-volatile semiconductor memory device is formed on the semiconductor substrate 250. As described, the processes for forming the first dielectric layer 330 and the second dielectric layer 335 may be repeatedly performed N times so that the dielectric structure 365 having the first and the second dielectric layer patterns 355 and 360 may be obtained.

According to some embodiments of the present invention, a first dielectric layer including a metal oxide doped with silicon is treated using ammonia plasma or nitrogen plasma while controlling a voltage difference between a ground and a susceptor on which a substrate is loaded. Thus, a second dielectric layer including a metal oxynitride doped with silicon may be formed on the first dielectric layer to have a sufficient content of nitrogen therein. As a result, a dielectric structure including the first and second dielectric layers may have improved dielectric characteristics and a leakage current through the dielectric structure may decrease.

Additionally, when the dielectric structure is employed for a gate insulation layer of a volatile semiconductor device or a dielectric layer of a capacitor or a non-volatile semiconductor device, capacitances and electrical characteristics of the volatile semiconductor device or the non-volatile semiconductor device may be greatly improved.

Furthermore, since the dielectric structure has at least one metal silicon oxide layer and at least one metal silicon oxynitride layer, the dielectric structure has a high dielectric constant and a good heat resistance so that the dielectric structure may not be damaged in a heat treatment process. Accordingly, the volatile semiconductor device or the non-volatile semiconductor device may also have good electrical characteristics.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a dielectric structure comprising:
   forming a first dielectric layer on a semiconductor substrate using a metal oxide doped with silicon;
   loading the semiconductor substrate having the first dielectric layer onto a susceptor disposed in a chamber; and
   forming a second dielectric layer on the first dielectric layer by treating the first dielectric layer with a plasma while controlling a voltage difference between the susceptor and a ground using a power source electrically connected to the chamber.

2. The method of claim 1, wherein the first dielectric layer is formed by a chemical vapor deposition (CVD) process, an atomic layer deposition (ALD) process, a physical vapor deposition (PVD) process or a pulse laser deposition (PLD) process.

3. The method of claim 1, wherein the metal oxide doped with silicon is selected from the group consisting of a metal oxide doped with silicon including transition metal in Group IV, a metal oxide doped with silicon including transition metal in Group V and a metal oxide doped with silicon including rare earth metal.

4. The method of claim 3, wherein the metal oxide doped with silicon is selected from the group consisting of titanium oxide doped with silicon, zirconium oxide doped with silicon, hafnium oxide doped with silicon, vanadium oxide doped with silicon, niobium oxide doped with silicon, tantalum oxide doped with silicon, scandium oxide doped with silicon, yttrium oxide doped with silicon and lanthanum oxide doped with silicon.

5. The method of claim 1, wherein the voltage difference between the susceptor and the ground is about 300V to about 500V.

6. The method of claim 1, wherein the plasma comprises ammonia plasma or nitrogen plasma.

7. The method of claim 6, wherein the first dielectric layer is treated at a temperature of about 300° C. to about 900° C. for about 60 seconds to about 180 seconds by applying a power of about 250 W to about 800 W.

8. The method of claim 1, wherein the second dielectric layer comprises a metal oxynitride doped with silicon.

9. The method of claim 1, wherein the second dielectric layer has about 5% to about 25% by weight of nitrogen.

10. The method of claim 8, wherein the second dielectric layer comprises material selected from the group consisting of a metal oxynitride doped with silicon including transition metal in Group IV a metal oxynitride doped with silicon including transition metal in Group V and a metal oxynitride doped with silicon including rare earth metal.

11. The method of claim 10, wherein the second dielectric layer comprises material selected from the group consisting of titanium oxynitride doped with silicon, zirconium oxynitride doped with silicon, hafnium oxynitride doped with silicon, vanadium oxynitride doped with silicon, niobium oxynitride doped with silicon, tantalum oxynitride doped with silicon, scandium oxynitride doped with silicon, yttrium oxynitride doped with silicon and lanthanum oxynitride doped with silicon.

12. The method of claim 1, prior to forming the first dielectric layer, further comprising forming a first conductive structure on the semiconductor substrate.

13. The method of claim 12, further comprising forming a second conductive structure on the second dielectric layer after forming the second dielectric layer.

14. The method of claim 1, wherein forming the first dielectric layer and forming the second dielectric layer are repeatedly performed N (N is a positive integer) times.

15. A method of manufacturing a semiconductor device comprising:
   forming a first dielectric layer on a semiconductor substrate using a metal oxide doped with silicon;
   loading the semiconductor substrate having the first dielectric layer onto a susceptor disposed in a chamber;
   forming a first dielectric structure on the semiconductor substrate by treating the first dielectric layer with a plasma while controlling a voltage difference between the susceptor and a ground using a power source electrically connected to the chamber, wherein the first dielectric structure includes the first dielectric layer and a second dielectric layer formed on the first dielectric layer;
   forming a gate structure on the first dielectric structure;
   forming a contact region at a portion of the semiconductor adjacent to the gate structure;
   forming a pad electrically connected to the contact region;
   forming a storage electrode electrically connected to the pad;
   forming a second dielectric structure on the storage electrode; and
   forming a plate electrode on the second dielectric structure.

16. The method of claim 15, wherein forming the second dielectric structure comprises:
   forming a third dielectric layer on the storage electrode using a metal oxide doped with silicon;
   loading the semiconductor substrate having the third dielectric layer onto the susceptor; and
   forming a fourth dielectric layer on the third dielectric layer by treating the third dielectric layer with a second plasma while controlling a second voltage difference between the susceptor and the ground using the power source.

17. The method of claim 16, wherein the first voltage difference is substantially same as the second voltage difference.

18. The method of claim 17, wherein each of the first voltage difference and the second voltage difference is in a range of about 300V to about 500V.

19. The method of claim 16, wherein the first dielectric layer and the third dielectric layer are formed by a chemical vapor deposition (CVD) process, an atomic layer deposition (ALD) process, a physical vapor deposition (PVD) process or a pulse laser deposition (PLD) process.

20. The method of claim 16, wherein the first dielectric layer and the third dielectric layer each comprise material selected from the group consisting of a metal oxide doped with silicon including transition metal in Group IV, a metal oxide doped with silicon including transition metal in Group V and a metal oxide doped with silicon including rare earth metal.

21. The method of claim 16, wherein each of the first plasma and the second plasma comprises ammonia plasma or nitrogen plasma.

22. The method of claim 16, wherein each of the first dielectric layer and the third dielectric layer is treated at a temperature of about 300° C. to about 900° C. for about 60 seconds to about 180 seconds by applying a power of about 250 W to about 800 W.

23. The method of claim 16, wherein the second dielectric layer and the fourth dielectric layer comprise metal oxynitride doped with silicon.

24. The method of claim 23, wherein the second dielectric layer and the fourth dielectric layer have about 5% to about 25% by weight of nitrogen.

25. The method of claim 23, wherein each of the second dielectric layer and the fourth dielectric layer comprises material selected from the group consisting of a metal oxynitride doped with silicon including transition metal in Group IV, a metal oxynitride doped with silicon including transition metal in Group V and a metal oxynitride doped with silicon including rare earth metal.

26. The method of claim 16, wherein forming the first dielectric layer and forming the second dielectric layer are repeatedly performed N (N is a positive integer) times.

27. The method of claim 26, wherein forming the third dielectric layer and forming the fourth dielectric layer are repeatedly performed N (N is a positive integer) times.

28. A method of manufacturing a semiconductor device comprising:
    forming a tunnel oxide layer pattern on the substrate;
    forming a floating gate on the tunnel oxide layer pattern;
    forming a first dielectric layer on the floating gate using a metal oxide doped with silicon;
    loading the semiconductor substrate having the first dielectric layer onto a susceptor disposed in a chamber;
    forming a dielectric structure on the floating gate by treating the first dielectric layer with a plasma while controlling a voltage difference between the susceptor and the ground using a power source electrically connected to the chamber, wherein the dielectric structure includes the first dielectric layer and a second dielectric layer formed on the first dielectric layer; and
    forming a control gate on the dielectric structure.

29. The method of claim 28, wherein the plasma comprises ammonia plasma or nitrogen plasma.

30. The method of claim 28, wherein forming the first dielectric layer and forming the second dielectric layer are repeatedly performed N (N is a positive integer) times.

* * * * *